United States Patent
Cho

(10) Patent No.: US 11,689,831 B2
(45) Date of Patent: Jun. 27, 2023

(54) IMAGE SENSOR AND ANALOG-TO-DIGITAL CONVERTER

(71) Applicant: SK hynix Inc., Gyeonggi-do (KR)

(72) Inventor: Taehee Cho, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 47 days.

(21) Appl. No.: 17/328,372

(22) Filed: May 24, 2021

(65) Prior Publication Data
US 2022/0124278 A1 Apr. 21, 2022

Related U.S. Application Data

(60) Provisional application No. 63/094,409, filed on Oct. 21, 2020.

(51) Int. Cl.
*H04N 25/772* (2023.01)
*H03M 1/56* (2006.01)
*H04N 25/65* (2023.01)
*H04N 25/75* (2023.01)
*H04N 25/709* (2023.01)
*H04N 25/778* (2023.01)

(52) U.S. Cl.
CPC ............ *H04N 25/772* (2023.01); *H03M 1/56* (2013.01); *H04N 25/65* (2023.01); *H04N 25/709* (2023.01); *H04N 25/75* (2023.01); *H04N 25/778* (2023.01)

(58) Field of Classification Search
CPC .... H04N 5/3745; H04N 5/363; H04N 5/3698; H04N 5/37457; H04N 5/378; H04N 5/37455; H04N 25/772; H04N 25/709; H04N 25/778; H04N 25/65; H04N 25/75; H03M 1/56
See application file for complete search history.

(56) References Cited

U.S. PATENT DOCUMENTS

| | | | |
|---|---|---|---|
| 8,390,486 B2 * | 3/2013 | Wang | H03M 1/1019 341/118 |
| 8,754,956 B2 * | 6/2014 | Lim | H03M 1/56 348/222.1 |
| 9,282,269 B2 * | 3/2016 | Sato | H04N 25/772 |
| 10,009,035 B1 | 6/2018 | LaCroix et al. | |
| 10,021,335 B2 * | 7/2018 | Niwa | H04N 25/772 |
| 10,924,701 B2 * | 2/2021 | Ebihara | H04N 12/772 |
| 11,399,150 B2 * | 7/2022 | Gao | H03M 1/56 |
| 2015/0124137 A1 * | 5/2015 | Sato | H04N 5/37455 |
| 2015/0249797 A1 * | 9/2015 | Yui | H04N 25/778 250/208.1 |

(Continued)

FOREIGN PATENT DOCUMENTS

KR 10-2015-0009527 1/2015

*Primary Examiner* — Marly S Camargo
(74) *Attorney, Agent, or Firm* — IP & T Group LLP

(57) ABSTRACT

An image sensor includes: a pixel outputting a pixel signal; a ramp voltage generation circuit suitable for generating a ramp voltage that changes at a first slope in a first section and generating the ramp voltage that changes at a second slope having a greater absolute value than the first slope in a second section following the first section; an operation amplifier suitable for comparing the pixel signal with the ramp voltage during the first section and the second section; and a counter circuit suitable for generating a digital code corresponding to the pixel signal in response to an output of the operation amplifier.

12 Claims, 5 Drawing Sheets

(56) References Cited

U.S. PATENT DOCUMENTS

| | | | |
|---|---|---|---|
| 2021/0021774 A1* | 1/2021 | Ebihara | H04N 5/378 |
| 2022/0277870 A1* | 3/2022 | Seo | H04N 25/778 |
| 2022/0116563 A1* | 4/2022 | Song | H03M 1/182 |
| 2022/0256107 A1* | 8/2022 | Lee | H04N 25/15 |

* cited by examiner

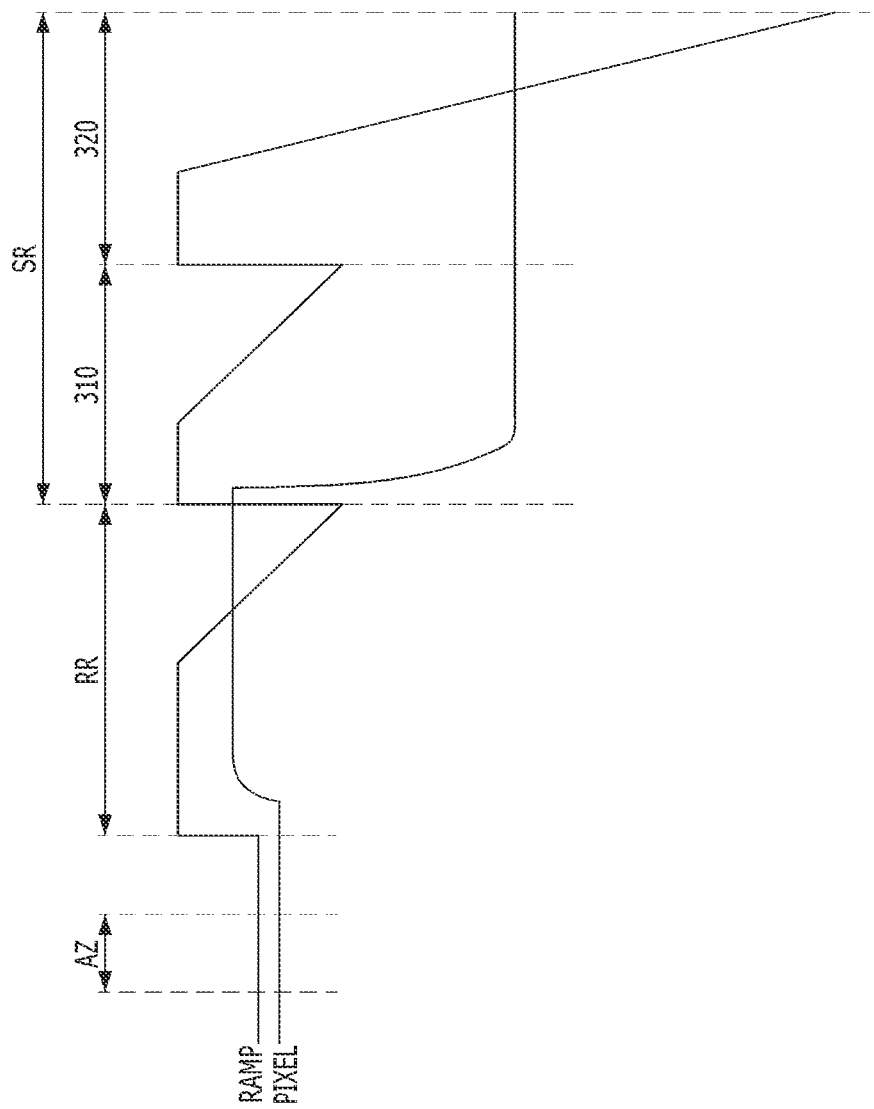

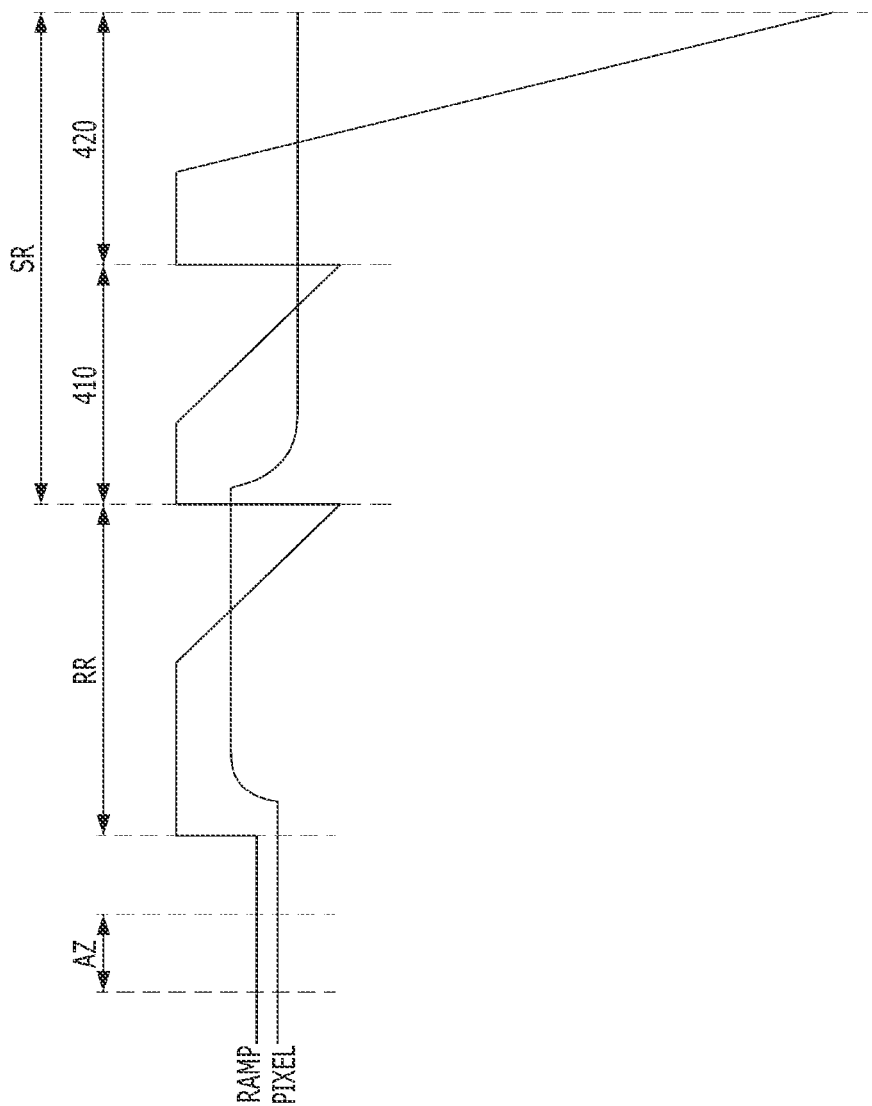

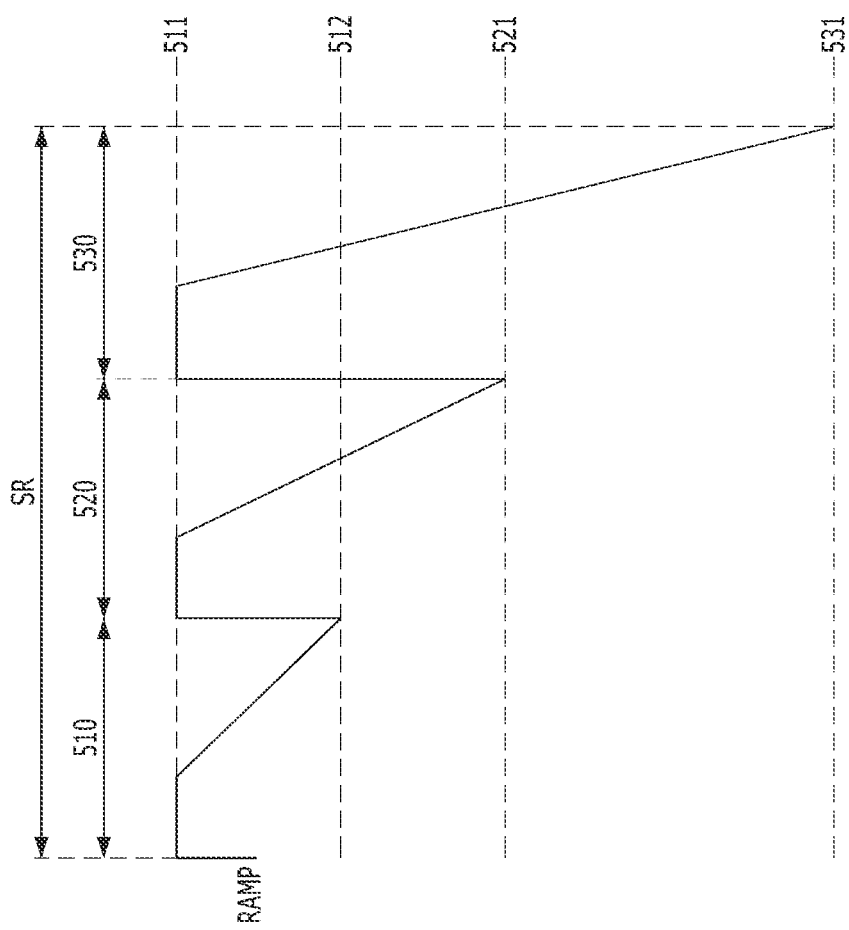

IMAGE SENSOR AND ANALOG-TO-DIGITAL CONVERTER

CROSS-REFERENCE TO RELATED APPLICATIONS

The present application claims priority to U.S. Provisional Application No. 63/094,409, filed on Oct. 21, 2020, which is incorporated herein by reference in its entirety.

BACKGROUND

1. Field

Various embodiments of the present invention relate to an image sensor and an analog-to-digital converter.

2. Description of the Related Art

In a CMOS image sensor (CIS), speed and power have a trade-off relationship. Therefore, current CMOS image sensors mainly adopt a column-parallel structure in which the speed and power have an optimal trade-off relationship, and for this reason, a simple type of a single-slope analog-to-digital converter (ADC) is mainly being used since there is a difficulty in that an analog-to-digital converter (ADC) is integrated into a narrow pixel width.

Along with the development of image sensors, increasing the accuracy (resolution) of analog-to-digital conversion is in higher demand. In the past, converting a pixel voltage into a 10-bit digital code was sufficient, but nowadays it is required to convert a pixel voltage into a 12-bit or 14-bit digital code. However, as the accuracy (resolution) of analog-to-digital conversion increases, the time required for analog-to-digital conversion increases, which is problematic. For example, when a voltage is converted into a 12-bit digital code, it may take four times as long as the time taken for converting a voltage into a 10-bit digital code.

SUMMARY

Embodiments of the present invention are directed to an image sensor that converts pixel signals into digital codes with high accuracy in a short time.

In accordance with an embodiment of the present invention, an image sensor includes: a pixel outputting a pixel signal; a ramp voltage generation circuit suitable for generating a ramp voltage that changes at a first slope in a first section and generating the ramp voltage that changes at a second slope having a greater absolute value than the first slope in a second section following the first section; an operation amplifier suitable for comparing the pixel signal with the ramp voltages during the first section and the second section; and a counter circuit suitable for generating a digital code corresponding to the pixel signal in response to an output of the operation amplifier.

In accordance with another embodiment of the present invention, a method for operating an image sensor includes: generating a pixel signal; generating a ramp voltage that changes at a first slope in a first section; generating a digital code by counting a clock in the first section; initializing, when a level of the ramp voltage does not reach a voltage level of the pixel signal during the first section, the digital code; generating a ramp voltage that changes at a second slope having a greater absolute value than the first slope in a second section; generating the digital code by counting the clock in the second section; and stopping, when the level of the ramp voltage reaches the voltage level of the pixel signal, the counting of the clock in response to the level of the ramp voltage and providing the digital code corresponding to the pixel signal.

In accordance with yet another embodiment of the present invention, an analog-to-digital converter includes: a ramp voltage generation circuit suitable for generating a ramp voltage that changes at a first slope in a first section and generating the ramp voltage that changes at a second slope having a greater absolute value than the first slope in a second section following the first section; an operation amplifier suitable for comparing a voltage to be converted with the ramp voltage in the first section and the second section; and a counter circuit suitable for generating a digital code corresponding to the voltage to be converted in response to an output of the operation amplifier.

In accordance with still another embodiment of the present invention, an image sensor may include: a ramp voltage generation circuit suitable for sequentially generating first to $N^{th}$ ramp voltages of an initial level during first to $N^{th}$ time sections, respectively, an $M^{th}$ ramp voltage having a greater ratio of decrease than a $(M-1)^{th}$ ramp voltage among the first to $N^{th}$ ramp voltages, M being between 2 to N; an operation amplifier suitable for generating indication of when any ramp voltage first reaches a level of a pixel signal among the first to $N^{th}$ ramp voltages; and a counter circuit suitable for generating an image signal corresponding to the pixel signal and having a resolution that depends on the indication.

BRIEF DESCRIPTION OF THE DRAWINGS

FIGS. 3 and 4 are timing diagrams illustrating an operation of the image sensor 100 shown in FIG. 1 in accordance with the embodiment of the present invention.

FIG. 5 is a timing diagram illustrating another example of a ramping operation of a ramp voltage RAMP in a signal readout section SR in accordance with the embodiment of the present invention.

DETAILED DESCRIPTION

Figure 1:
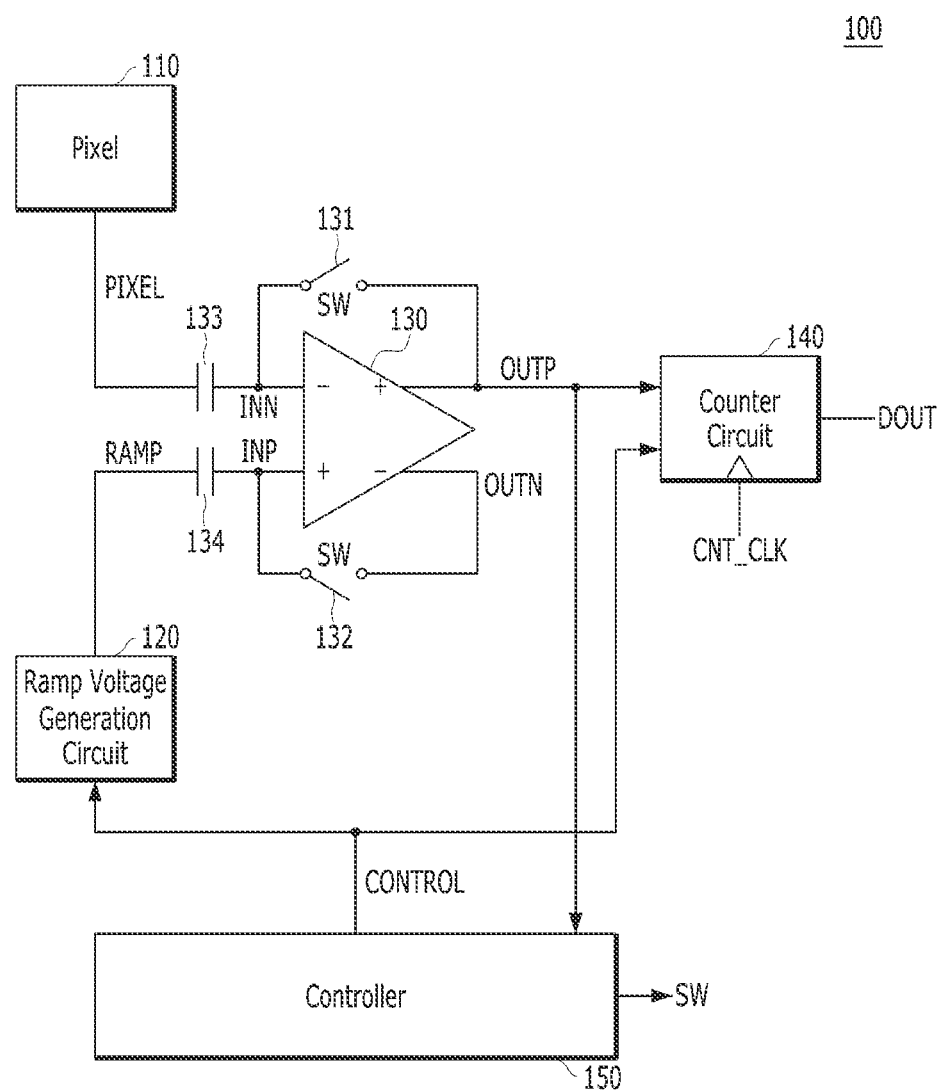
FIG. 1 is a block diagram illustrating an image sensor 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an image sensor 100 in accordance with an embodiment of the present invention.

Referring to FIG. 1, the image sensor 100 may include a pixel 110, a ramp voltage generation circuit 120, an operation amplifier 130, a counter circuit 140, a controller 150, switches 131 and 132, and capacitors 133 and 134.

The pixel 110 may output a pixel signal PIXEL based on sensed light. A plurality of pixels 110 may be provided in the form of an array including a plurality of rows and a plurality of columns. Here, only one pixel 110 is illustrated for the sake of simple description.

The ramp voltage generation circuit 120 may generate a ramp voltage RAMP. The slope of the ramp voltage RAMP which is generated by the ramp voltage generation circuit 120 may vary for each operation section. This will be described in detail later with reference to FIGS. 3 to 5.

The operation amplifier 130 may receive the pixel signal PIXEL and the ramp voltage RAMP through the capacitors 133 and 134, respectively. The operation amplifier 130 may compare the level of the pixel signal PIXEL input to an input terminal INN through the capacitor 133 with the level of the ramp voltage RAMP input to an input terminal INP through the capacitor 134, and output the comparison result to an output terminal OUTP. The input terminal INN may be a negative (−) input terminal, and the input terminal INP may be a positive (+) input terminal, and the output terminal OUTP may be a positive (+) output terminal, and an output terminal OUTN may be a negative (−) output terminal. The switches 131 and 132 may be for an auto-zeroing operation of the operation amplifier 130. During the auto-zeroing operation, the switches 131 and 132 may be turned on. The switch 131 may electrically connect the input terminal INN and the output terminal OUTP to each other, and the switch 132 may electrically connect the input terminal INP and the output terminal OUTN to each other. The switches 131 and 132 may be turned on/off in response to a signal SW.

The counter circuit 140 may count a clock CNT_CLK in response to a signal from the output terminal OUTP of the operation amplifier 130, and as a result, the counter circuit 140 may generate a digital code DOUT.

The controller 150 may control the ramp voltage generation circuit 120, the switches 131 and 132, and the counter circuit 140 in such a manner that an operation appropriate for each section of a reset read section, a first section, and a second section is performed. The control operation of the controller 150 will be described in detail later with reference to FIGS. 3 to 5. In the drawing, 'CONTROL' may represent the control of the controller 150.

In the image sensor 100 of FIG. 1, the constituent elements other than the pixel 110 may be the constituent elements for converting an analog voltage PIXEL output from the pixel 110 into a digital code DOUT. Therefore, the present invention may be applied not only to an image sensor but also to a general analog-to-digital converter for converting an analog voltage into a digital code.

Figure 2:
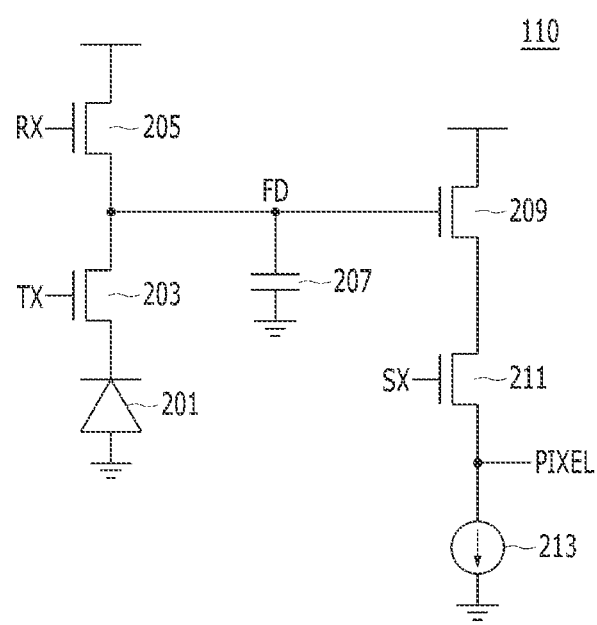
FIG. 2 is a schematic diagram illustrating a pixel 110 shown in FIG. 1 in accordance with the embodiment of the present invention.

FIG. 2 is a schematic diagram illustrating the pixel 110 shown in FIG. 1 in accordance with the embodiment of the present invention.

Referring to FIG. 2, the pixel 110 may include a photosensor 201, a transfer transistor 203, a reset transistor 205, a capacitor 207, a driving transistor 209, a selection transistor 211, and a current source 213.

The photosensor 201 may perform a photoelectric conversion function. The photosensor 201 may be coupled between a ground voltage terminal and the transfer transistor 203. The photosensor 201 may receive light from the outside and generate photo charges based on the received light. In an embodiment, the photosensor 201 may be realized using at least one among a photo diode, a photo transistor, a photo gate, a pinned photo diode, and a combination thereof.

The transfer transistor 203 may transfer the photo charges of the photosensor 201 to a floating diffusion node FD in response to a transfer signal TX. Here, the floating diffusion node FD may be a diffusion region that is coupled to the transfer transistor 203 and the reset transistor 205, and the floating diffusion node FD may be a node in which charges corresponding to an image signal or charges corresponding to an initialization voltage are accumulated. The capacitor 207 for storing charges may be coupled to the floating diffusion node FD.

The reset transistor 205 may transfer a power source voltage to the floating diffusion node FD in response to a reset control signal RX. In other words, the reset transistor 205 may reset the photo charges stored in the floating diffusion node FD in response to the reset control signal RX.

The driving transistor 209 may have a gate that is coupled to the floating diffusion node FD, and a drain and a source that are coupled between the power source voltage terminal and the selection transistor 211. The driving transistor 209 may amplify the voltage of the floating diffusion node FD.

The selection transistor 211 may electrically connect the source terminal of the driving transistor 209 and the output line PIXEL to each other in response to a selection signal SX.

The current source 213 may sink a predetermined current from the output line PIXEL to a ground terminal. The current source 213 may be shared by a plurality of pixels.

The pixel signal may be output from the output line PIXEL, and the voltage level of the output line PIXEL may be determined based on the amount of current sourced from the driving transistor 209 to the output line PIXEL and the amount of current sunk from the current source 213 to the output line PIXEL. Consequently, the voltage level of the output line PIXEL may increase as the voltage level of the floating diffusion node FD increases.

FIGS. 3 and 4 are timing diagrams illustrating an operation of the image sensor 100 shown in FIG. 1. FIG. 3 illustrates an operation when the voltage level of the pixel signal generated in the pixel 100 is low, and FIG. 4 illustrates an operation when the voltage level of the pixel signal generated in the pixel 100 is high.

'AZ' of FIG. 3 may represent an auto-zeroing section. In this section AZ, the signal SW may be activated by the controller 150 and the switches 131 and 132 may be turned on, so that an auto-zeroing operation of the operation amplifier 130 may be performed.

'RR' of FIG. 3 may represent a reset readout section. In this section, a reset signal may be output from the pixel 100, and an operation of converting the reset signal into a digital code DOUT may be performed by the ramp voltage generation circuit 120, the operation amplifier 130, and the counter circuit 140.

In a reset readout section RR, in the pixel 100, the reset control signal RX may be activated to reset the floating diffusion node FD, and the selection signal SX may be activated to output the reset signal to the output line PIXEL of the pixel 100. It may be seen in FIG. 3 that the voltage level of the output line PIXEL changes in the reset readout section RR. From this moment, the reset signal of the pixel 100 may be output to the output line PIXEL.

In the reset readout section RR, a ramping operation in which the ramp voltage RAMP rises and then falls may be performed. The counter circuit 140 may generate a digital code DOUT by counting the number of toggles of the clock CNT_CLK from a moment when the ramp voltage RAMP starts to fall to a moment when the ramp voltage RAMP reaches the voltage level of the output line PIXEL, that is, a moment when the output OUTP of the operation amplifier 130 transitions. Here, the digital code DOUT may be a code obtained by converting the reset signal of the pixel 100 into a digital signal. In the reset readout section RR, the ramp voltage RAMP may fall at a first slope having a small absolute value. Therefore, the resolution of the digital code DOUT generated by the counter circuit 140 in the reset readout section RR may be high. For example, the digital code DOUT generated in the reset readout section RR may have a resolution of 12 bits.

'SR' of FIG. 3 may represent a signal readout section. In this section, a pixel signal may be output from the pixel 100, and an operation of converting the pixel signal into a digital code DOUT may be performed by the ramp voltage generation circuit 120, the operation amplifier 130, and the counter circuit 140.

In the signal readout section SR, a transfer signal TX may be activated in the pixel 100 to transfer photo charges of the photosensor 201 to the floating diffusion node FD, and the selection signal SX may be activated to output the pixel signal of the pixel 100, that is, a signal corresponding to the light sensed by the pixel 100, to the output line PIXEL of the pixel 100. It may be seen in FIG. 3 that the voltage level of the output line PIXEL changes in the signal readout section SR. From this moment, the pixel signal of the pixel 100 may be output to the output line PIXEL.

In the signal readout section SR, a ramping operation in which the ramp voltage RAMP rises and then falls may be performed in two sections 310 and 320. The first section 310 may be a section for digitally converting the pixel signal into a high resolution, and the second section 320 may be a section for digitally converting a pixel signal into a low resolution when digital conversion of the pixel signal fails in the first section 310.

In the section 310, a ramping operation in which the ramp voltage RAMP rises and then falls may be performed. The counter circuit 140 may generate a digital code DOUT by counting the number of toggles of the clock CNT_CLK from a moment when the ramp voltage RAMP starts to fall to a moment when the ramp voltage RAMP reaches the voltage (pixel signal) of the output line PIXEL. However, it may be seen that the ramp voltage RAMP does not reach the voltage level of the output line PIXEL in the section 310 and the levels of the two voltages do not meet each other. In other words, the digital conversion of the pixel signal in the section 310 may be a failure. In the section 310, the ramp voltage RAMP may fall at the first slope, which is the same slope as that of the reset readout section RR. Therefore, this section 310 may be a section in which a digital code DOUT having a high resolution is attempted to be generated.

Since it fails to convert the voltage of the output line PIXEL into a digital code DOUT in the section 310, the operation of converting the voltage of the output line PIXEL into a digital code DOUT may be attempted again in the section 320. Under the control of the controller 150, the counter circuit 140 may initialize the digital code DOUT and generate a new digital code in the section 320. Also, under the control of the controller 150, the ramp voltage generation circuit 120 may generate a ramp voltage RAMP of a slope that is different from that of the section 310. The controller 150 may be able to determine whether the conversion operation into the digital code DOUT succeeds or fails in the section 310 by monitoring the output OUTP of the operation amplifier.

In the section 320, a ramping operation in which the ramp voltage RAMP rises and then falls may be performed. The ramp voltage RAMP may fall at a second slope whose absolute value is greater than that in the section 310. For example, the second slope may be $2^N$ (where N is an integer equal to or greater than 1) times the first slope. It is illustrated herein as an example that the second slope is four times the first slope. The counter circuit 140 may generate a digital code DOUT by counting the number of toggles of the clock CNT_CLK from a moment when the ramp voltage RAMP starts to fall in the section 320 to a moment when the ramp voltage RAMP reaches the voltage (pixel signal) of the output line PIXEL, that is, a moment when the output OUTP of the operation amplifier 130 transitions. In the section 320, since the ramp voltage RAMP falls at the second slope having a large absolute value, the ramp voltage RAMP and the voltage of the output line PIXEL may meet each other. In the section 320, since the ramp voltage RAMP falls steeply at a slope of $2^N$ times those of the sections RR and 310, the digital code DOUT generated in the section 320 may have a resolution of $1/(2^N)$ times that of the digital code DOUT generated in the sections RR and 310. Since it is illustrated herein that the second slope is four times the first slope, the digital code DOUT generated in the section 320 may have a resolution of ¼ times the resolution of the digital code DOUT generated in the section RR. In other words, when the digital code DOUT generated in the section RR is a 12-bit code, the digital code DOUT generated in the section 320 may be a 10-bit code.

An accurate image sensed by the pixel 100 may be obtained as [pixel signal]–[reset signal]. The pixel signal may be generated as a digital code DOUT having a resolution of 10 bits in the section 320, and the reset signal may be generated as a digital code DOUT having a resolution of 12 bits in the section RR. Accordingly, the final image may be obtained as [digital code generated in the section 320*4]–[digital code generated in the section RR], and this image may be of a 12-bit code.

'AZ' of FIG. 4 may represent an auto-zeroing section. In the section AZ, the signal SW may be activated by the controller 150, and the switches 131 and 132 may be turned on to perform an auto-zeroing operation of the operation amplifier 130.

'RR' of FIG. 4 may represent a reset readout section. In this section RR, a reset signal may be output from the pixel 100, and an operation of converting the reset signal into a digital code DOUT by the ramp voltage generation circuit 120, the operation amplifier 130, and the counter circuit 140 may be performed.

In the reset readout section RR, the reset control signal RX may be activated to reset the floating diffusion node FD in the pixel 100, and the selection signal SX may be activated to output the reset signal to the output line PIXEL of the pixel 100. It may be seen in FIG. 4 that the voltage level of the output line PIXEL changes in the reset readout section RR. From this moment, the reset signal of the pixel 100 may be output to the output line PIXEL.

In the reset readout section RR, a ramping operation in which the ramp voltage RAMP rises and then falls may be performed. The counter circuit 140 may generate a digital code DOUT by counting the number of toggles of the clock CNT_CLK from a moment when the ramp voltage RAMP starts to fall to a moment when the ramp voltage RAMP reaches the voltage of the output line PIXEL, that is, to a moment when the output OUTP of the operation amplifier 130 transitions. Here, the digital code DOUT may be a code obtained by converting the reset signal of the pixel 100 into a digital signal. In the reset readout section RR, the ramp voltage RAMP may fall at the first slope having a small absolute value. Accordingly, the digital code DOUT generated by the counter circuit 140 in the reset readout section RR may have a high resolution. For example, the digital code DOUT generated in the reset readout section RR may have a resolution of 12 bits.

'SR' of FIG. 4 may represent a signal readout section. In this section, the pixel signal may be output from the pixel 100, and an operation of converting the pixel signal into a digital code DOUT by the ramp voltage generation circuit 120, the operation amplifier 130, and the counter circuit 140 may be performed.

In the signal readout section SR, the transfer signal TX may be activated in the pixel 100 to transfer photo charges of the photosensor 201 to the floating diffusion node FD, and the selection signal SX may be activated to output a pixel signal of the pixel 100, that is, a signal corresponding to the light sensed by the pixel 100, to the output line PIXEL of the pixel 100. It may be seen in FIG. 4 that the voltage level of the output line PIXEL changes in the signal readout section SR. From this moment, the pixel signal of the pixel 100 may be output to the output line PIXEL.

In the signal readout section SR, a ramping operation in which the ramp voltage RAMP rises and then falls may be performed in the two sections 410 and 420. A first section 410 may be a section for digitally converting a pixel signal into a high resolution, and a second section 420 may be a section for digitally converting a pixel signal into a low resolution when digital conversion of the pixel signal fails in the first section 410.

In the section 410, a ramping operation in which the ramp voltage RAMP rises and then falls may be performed. The counter circuit 140 may generate a digital code DOUT by counting the number of toggles of the clock CNT_CLK from a moment when the ramp voltage RAMP starts to fall to a moment when the ramp voltage RAMP reaches the voltage (pixel signal) of the output line PIXEL, that is, to a moment when the output OUTP of the operation amplifier 130 transitions. In FIG. 4, since the voltage level of the output line PIXEL is relatively high, there may be a moment when the ramp voltage RAMP and the voltage level of the output line PIXEL become the same, even in the section 410. The digital code DOUT generated in the section 410 may be a code obtained by converting the pixel signal of the pixel 100 into a digital signal. In the section 410, since the ramp voltage falls at a first slope, the digital code DOUT generated in the section 410 may have a high resolution, for example, a resolution of 12 bits.

In the section 420, a ramping operation in which the ramp voltage RAMP rises and then falls at a second slope may be performed again. Since the pixel signal of the output line PIXEL is already successfully converted into the digital code DOUT in the section 410, the generation of the digital code DOUT may not be attempted again in the section 420. In other words, when the conversion into the digital code DOUT is successfully performed in the section 410, the controller 150 may not initialize the digital code DOUT of the counter circuit 140, and control the counter circuit 140 not to perform a counting operation.

An accurate image sensed by the pixel 100 may be obtained as [pixel signal]−[reset signal]. The pixel signal may be generated as a digital code DOUT of a 12-bit resolution in the section 410, and the reset signal may be generated as a digital code DOUT of a 12-bit resolution in the section RR. Therefore, the final image may be obtained as [the digital code generated in the section 410]−[the digital code generated in the section RR], and this image may be of a 12-bit code.

Referring to FIGS. 3 and 4, a reset signal having a high voltage level may go through analog-to-digital conversion into a high resolution in the section RR. When the voltage level is high (e.g., in case of FIG. 4), the pixel signal may go through analog-to-digital conversion into a high resolution in the section 410. When the voltage level is low (e.g., in case of FIG. 3), the pixel signal may go through analog-to-digital conversion into a low resolution in the section 320. When the voltage level of the pixel signal is high, it means that the amount of light sensed by the pixel 100 is small. In this case, since it should be possible to distinguish even a minute difference in the amounts of the sensed light, the pixel signal may have to go through analog-to-digital conversion into a high resolution. On the other hand, when the voltage level of the pixel signal is low, it means that the amount of light sensed by the pixel 100 is large. In this case, it may be less required to distinguish even a minute difference in the amounts of light than when the amount of the sensed light is small. Therefore, when the amount of light sensed by the pixel 100 is large, even though the pixel signal goes through analog-to-digital conversion into a low resolution, the quality of an image may not be significantly affected.

When the voltage level of the pixel signal is high, it does not take much time to analog-to-digital convert the pixel signal into a high resolution, but when the voltage level of the pixel signal is low, it takes a very long time to analog-to-digital convert the pixel signal into a high resolution. Accordingly, when the voltage level of the pixel signal is high, the image sensor 100 may analog-to-digital convert the pixel signal into a high resolution, and when the voltage level of the pixel signal is low, the image sensor 100 may analog-to-digital convert the pixel signal into a low resolution. In other words, when high-resolution analog-to-digital conversion is required due to a high voltage level of the pixel signal, a high-resolution analog-to-digital conversion operation may be performed quickly, and when high-resolution analog-to-digital conversion is not required due to a low voltage level of the pixel signal, a low-resolution analog-to-digital conversion operation may be performed.

FIG. 5 is a timing diagram illustrating another example of a ramping operation of the ramp voltage RAMP in the signal readout section SR in accordance with the embodiment of the present invention. It is illustrated in FIGS. 3 and 4 that the signal readout section SR is divided into two sections, which are a high-resolution conversion section 310 and 410 and a low resolution conversion section 320 and 420, and it is illustrated in FIG. 5 that the signal readout section SR is divided into three sections, which are a high-resolution conversion section 510, a medium-resolution conversion section 520, and a low-resolution conversion section 530.

Referring to FIG. 5, in the high-resolution conversion section 510, a ramping operation in which the ramp voltage RAMP rises and then falls at a low slope may be performed. When the voltage level of the pixel signal that is output to the output line PIXEL of the pixel 100 is between 511 and 512, the ramp voltage RAMP may reach the voltage level of the pixel signal in the section 510. Therefore, the pixel signal may be digitally converted to a high resolution (e.g., 12 bits) to generate a digital code DOUT.

In the medium-resolution conversion section 520, a ramping operation in which the ramp voltage RAMP rises and then falls at a medium slope may be performed. When the voltage level of the pixel signal that is output to the output line PIXEL of the pixel 100 is between 512 and 521, the ramp voltage RAMP may reach the voltage level of the pixel signal in the section 520. Therefore, the pixel signal may be digitally converted into a medium resolution (e.g., 11 bits) to generate a digital code DOUT.

In the low-resolution conversion section 530, a ramping operation in which the ramp voltage RAMP rises and then falls at a high slope may be performed. When the voltage level of the pixel signal that is output to the output line PIXEL of the pixel 100 is between 521 and 531, the ramp voltage RAMP may reach the voltage level of the pixel signal in the section 530. Therefore, the pixel signal may be digitally converted into a low resolution (e.g., 10 bits) to generate a digital code DOUT.

Although FIG. 5 illustrates converting the pixel voltage into a digital code DOUT by using three levels of resolution, it is obvious to those skilled in the art to which the present invention pertains that the pixel voltage may be converted into a digital code DOUT by using more levels of resolution.

According to the embodiment of the present invention, a digital image of a high quality may be generated in a short time.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
    a pixel outputting a pixel signal;
    a ramp voltage generation circuit suitable for generating a ramp voltage that changes at a first slope in a first section and generating the ramp voltage that changes at a second slope having a greater absolute value than the first slope in a second section following the first section;
    an operation amplifier suitable for comparing the pixel signal with the ramp voltages during the first section and the second section; and
    a counter circuit suitable for generating a digital code corresponding to the pixel signal in response to an output of the operation amplifier,
    wherein the counter circuit generates the digital code by counting a clock until the output of the operation amplifier transitions in the first section, and
    wherein when the output of the operation amplifier does not transition in the first section, the counter circuit generates the digital code by counting the clock until the output of the operation amplifier transitions in the second section.

2. The image sensor of claim 1, wherein the absolute value of the second slope is 2^N times an absolute value of the first slope, N being an integer equal to or greater than 1.

3. The image sensor of claim 1,
    wherein the ramp voltage generation circuit is further suitable for generating the ramp voltage to change at a third slope having a greater absolute value than the second slope in a third section following the second section, and
    wherein when the output of the operation amplifier does not transition in the second section, the counter circuit generates the digital code by counting the clock until the output of the operation amplifier transitions in the third section.

4. The image sensor of claim 1,
    wherein the pixel is further suitable for outputting a reset signal in a reset read section,
    wherein the ramp voltage generation circuit generates the ramp voltage that changes at the first slope in the reset read section, and
    wherein the operation amplifier is further suitable for comparing the reset signal with the ramp voltage in the reset read section.

5. The image sensor of claim 4, wherein the counter circuit is further suitable for generating a digital code corresponding to the reset signal by counting the clock until the output of the operation amplifier transitions in the reset read section.

6. A method for operating an image sensor, comprising:
    generating a pixel signal;
    generating a ramp voltage that changes at a first slope in a first section;
    generating a digital code by counting a clock in the first section;
    initializing, when a level of the ramp voltage does not reach a voltage level of the pixel signal during the first section, the digital code;
    generating a ramp voltage that changes at a second slope having a greater absolute value than the first slope in a second section;
    generating the digital code by counting the clock in the second section; and
    stopping, when the level of the ramp voltage reaches the voltage level of the pixel signal, the counting of the clock in response to the level of the ramp voltage and providing the digital code corresponding to the pixel signal.

7. The method of claim 6, further comprising, before the generating of the pixel signal:
    generating a reset signal;
    generating a ramp voltage that changes at the first slope in a reset read section;
    counting the digital code by counting the clock in the reset read section; and
    stopping, when the level of the ramp voltage reaches the voltage level of the reset signal, the counting of the clock in response to the level of the ramp voltage and providing the digital code corresponding to the reset signal.

8. The method of claim 6, wherein the absolute value of the second slope is 2^N times an absolute value of the first slope, N being an integer equal to or greater than 1.

9. An analog-to-digital converter, comprising:
    a ramp voltage generation circuit suitable for generating a ramp voltage that changes at a first slope in a first section and generating the ramp voltage that changes at a second slope having a greater absolute value than the first slope in a second section following the first section;
    an operation amplifier suitable for comparing a voltage to be converted with the ramp voltage in the first section and the second section; and
    a counter circuit suitable for generating a digital code corresponding to the voltage to be converted in response to an output of the operation amplifier,
    wherein the counter circuit generates the digital code by counting a clock until the output of the operation amplifier transitions in the first section, and
    wherein when the output of the operation amplifier does not transition in the first section, the counter circuit generates the digital code by counting the clock until the output of the operation amplifier transitions in the second section.

10. The analog-to-digital converter of claim 9, wherein the absolute value of the second slope is 2^N times an absolute value of the first slope, N being an integer equal to or greater than 1.

11. The analog-to-digital converter of claim 9,
    wherein the ramp voltage generation circuit is further suitable for generating the ramp voltage that changes at a third slope having a greater absolute value than the second slope in a third section following the second section, and wherein when the output of the operation amplifier does not transition in the second section, the counter circuit generates the digital code by counting the clock until the output of the operation amplifier transitions in the third section.

12. An image sensor comprising:

a ramp voltage generation circuit suitable for sequentially generating first to $N^{th}$ ramp voltages of an initial level during first to $N^{th}$ time sections, respectively, an $M^{th}$ ramp voltage having a greater ratio of decrease than a $(M-1)^{th}$ ramp voltage among the first to $N^{th}$ ramp voltages, M being between 2 to N;

an operation amplifier suitable for generating indication of when any ramp voltage first reaches a level of a pixel signal among the first to $N^{th}$ ramp voltages; and a counter circuit suitable for generating an image signal corresponding to the pixel signal and having a resolution that depends on the indication.

* * * * *